(12) United States Patent
Shang et al.

(10) Patent No.: US 10,860,813 B2
(45) Date of Patent: Dec. 8, 2020

(54) USING A MEMORY CARD TO IDENTIFY THE LOCATION OF A SERVER

(71) Applicant: Lenovo Enterprise Solutions (Singapore) Pte. Ltd., Singapore (SG)

(72) Inventors: Xiao Le Shang, Shanghai (CN); Xiao Li Yin, Shanghai (CN); Xu Fei Zhang, Shanghai (CN)

(73) Assignee: LENOVO ENTERPRISE SOLUTIONS (SINGAPORE) PTE. LTD., Singapore (SG)

(*) Notice: Subject to any disclaimer, the term of this patent is extended or adjusted under 35 U.S.C. 154(b) by 5 days.

(21) Appl. No.: 16/046,008

(22) Filed: Jul. 26, 2018

(65) Prior Publication Data

US 2019/0042807 A1 Feb. 7, 2019

(30) Foreign Application Priority Data

Aug. 1, 2017 (CN) .......................... 2017 1 0646641

(51) Int. Cl.
| | |
|---|---|
| *G06K 7/00* | (2006.01) |
| *G06K 7/10* | (2006.01) |
| *H05K 7/14* | (2006.01) |
| *H04L 29/12* | (2006.01) |

(52) U.S. Cl.
CPC ....... *G06K 7/0013* (2013.01); *G06K 7/10297* (2013.01); *H05K 7/1498* (2013.01); *H04L 61/2007* (2013.01); *H04L 61/609* (2013.01)

(58) Field of Classification Search
CPC .................................................. G06K 7/0013
USPC ................................................... 235/451, 385
See application file for complete search history.

(56) References Cited

U.S. PATENT DOCUMENTS

| | | | |
|---|---|---|---|
| 2002/0095487 A1* | 7/2002 | Day ........................ | H04L 29/06 709/223 |
| 2004/0243749 A1* | 12/2004 | Learmonth ........... | G06F 3/0605 710/73 |
| 2005/0237194 A1* | 10/2005 | VoBa .................. | G08B 13/2417 340/572.1 |
| 2010/0060452 A1* | 3/2010 | Schuster ................ | G06Q 10/06 340/572.1 |
| 2012/0087301 A1* | 4/2012 | Brandt ................. | G06Q 10/087 370/328 |
| 2015/0069119 A1* | 3/2015 | Hastman .............. | G06Q 10/087 235/385 |
| 2015/0148686 A1* | 5/2015 | Baym .................... | A61B 5/445 600/476 |
| 2015/0256394 A1* | 9/2015 | Palmer .................... | H04L 12/10 709/221 |
| 2015/0326437 A1* | 11/2015 | Shrestha .............. | H04B 5/0025 709/222 |

(Continued)

*Primary Examiner* — Allyson N Trail
(74) *Attorney, Agent, or Firm* — Jeffrey Streets

(57) ABSTRACT

A server system includes a server rack having a plurality of slots, a plurality of servers and a plurality of memory cards. Each server is positioned on a respective slot of the server rack. Each memory card is programmed with information relating to a location of the respective server at the server rack. Each server comprises a controller and an interface coupled to the controller. The respective memory card is brought into an electrical connection with the interface to transmit the information relating to the corresponding location of the respective server to the controller.

12 Claims, 5 Drawing Sheets

(56) References Cited

U.S. PATENT DOCUMENTS

| | | | |
|---|---|---|---|
| 2016/0193095 A1* | 7/2016 | Roussy | A61G 7/002 5/11 |
| 2016/0275737 A1* | 9/2016 | Cai | G06F 19/3462 |
| 2017/0033839 A1* | 2/2017 | Abbondanzio | H04B 5/0056 |
| 2017/0091607 A1* | 3/2017 | Emeis | G06T 19/006 |
| 2017/0094632 A1* | 3/2017 | Shetty | G01S 5/0284 |
| 2017/0361463 A1* | 12/2017 | Geraghty | B25J 9/1664 |

* cited by examiner

USING A MEMORY CARD TO IDENTIFY THE LOCATION OF A SERVER

CROSS-REFERENCE TO RELATED APPLICATIONS

This application claims priority under 35 U.S.C. § 119 to Chinese Patent Application No. 201710646641.8 filed Aug. 1, 2017, the entire text of which is specifically incorporated by reference herein.

BACKGROUND

The present disclosure relates to a systems and devices for identifying the location of a server.

BACKGROUND OF THE RELATED ART

As demands for server clusters and related server computing resources such as cloud services increase, it is desirable to accurately and quickly identify a server in a network environment. Existing server identification requires a user, for instance an administrator or other service personnel, to manually mount a physical asset tag or an e-tag to each server device based on their particular location on a server rack. The user will then manually register the server's serial number and location on both a server management system which the administrator uses to manage the server cluster, and on a baseboard management controller which is the management system local to the individual server. An Internet Protocol (IP) address must then be manually configured for a first access of the server from the server management system. This manner of server identification configuration is labor intensive and often prone to human error, especially when the server cluster includes numerous servers or includes servers operated in multiple locations. Server identification may also be a problem during server replacement, where there is a high likelihood of committing a server identification error.

BRIEF SUMMARY

One embodiment provides a server system comprising a server rack including a plurality of slots, a plurality of servers, and a plurality of memory cards. Each server is positioned at a respective slot within the server rack, and each server includes a controller and an externally-accessible interface coupled to the controller. Each memory card has a non-volatile storage module storing a location identifier that uniquely identifies one of the plurality of slots, and each memory card is operable to communicate through the externally-accessible interface of a respective one of the servers to transmit the stored location identifier to the controller of the respective server.

Another embodiment provides a server comprising a management controller and an externally-accessible interface coupled to the management controller, wherein the interface is configured to selectively couple with a memory card and enable the management controller to receive a location identifier stored by the memory card.

A further embodiment provides a memory card comprising a storage module storing a location identifier that identifies a location within a server rack, and an interface coupled to the storage module for communicating with a server positioned at the identified location within the server rack. The memory card is operative to communicate, via the interface, with the server positioned at the identified location within the server rack, and the server is operative to read the location identifier stored by the storage module.

DETAILED DESCRIPTION

Figure 1:
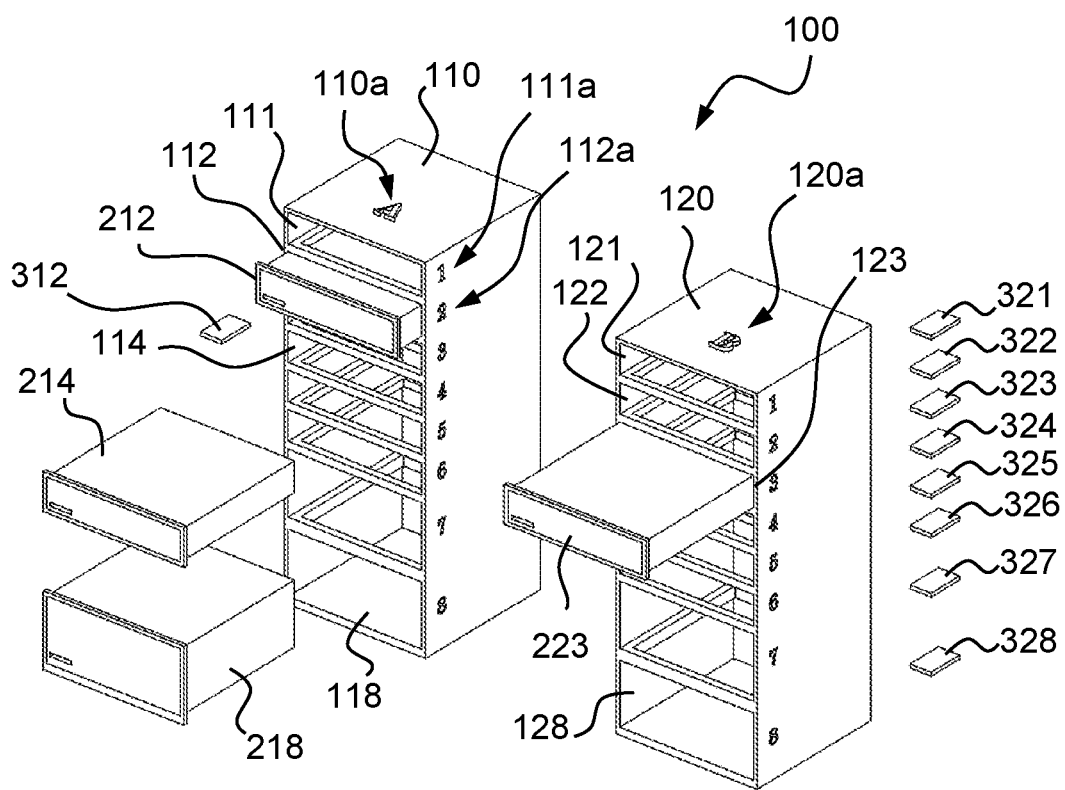
FIG. 1 is a diagram of an embodiment of a server system.

One embodiment provides a server system comprising a server rack including a plurality of slots, a plurality of servers, and a plurality of memory cards. Each server is positioned at a respective slot within the server rack, and each server includes a controller and an externally-accessible interface coupled to the controller. Each memory card has a non-volatile storage module storing a location identifier that uniquely identifies one of the plurality of slots, and each memory card is operable to communicate through the externally-accessible interface of a respective one of the servers to transmit the stored location identifier to the controller of the respective server. The non-volatile storage module may take various forms, such as an electrically erasable programmable read-only memory chip.

The interface may include a card reader coupled to the server, wherein the card reader receives the memory card therein to establish communication with the memory card. In one option, the card reader may be fixedly mounted to the server and may open to a front side of the server for receiving the memory card. In another option, the interface may include a cable connector mounted to the server, such that the card reader may be detachably connected to the cable connector.

The memory card may further include a wireless communication module coupled to the non-volatile storage module to wirelessly transmit the location identifier stored on the memory card to the card reader. One non-limiting example of a wireless communication module includes a near-field communication chip.

The controller may, in various embodiments, derive an Internet Protocol address for the server based on the location identifier of the respective server and a server identifier associated with the server.

Another embodiment provides a server comprising a management controller and an externally-accessible interface coupled to the management controller, wherein the interface is configured to selectively couple with a memory card and enable the management controller to receive a location identifier stored by the memory card.

The externally-accessible interface may include a card reader coupled to the server, wherein the card reader receives the memory card therein and establishes communication with the memory card. In one option, the card reader may be fixedly secured to the server and may open to a front side of the server for receiving the memory card. In another option, the interface may include a cable connector mounted to the server, such that the card reader may be detachably connected to the cable connector.

A further embodiment provides a memory card comprising a storage module storing a location identifier that identifies a location within a server rack, and an interface coupled to the storage module for communicating with a server positioned at the identified location within the server rack. The memory card is operative to communicate, via the interface, with the server positioned at the identified location within the server rack, and the server is operative to read the location identifier stored by the storage module.

The interface may include a wireless module, such as a near-field communication chip, configured to establish wireless communication with the server. Preferably, any such wireless module may wirelessly transmit the location identifier to the server. However, the interface may include a plurality of contact pads configured to establish wired communication with the server. In one option, the plurality of contact pads support an inter-integrated circuit (I2C) bus connection with the interface of the server.

FIG. 1 is a diagram of an embodiment of a server system including a plurality of server racks 110, 120. Each server rack 110, 120 has multiple locations, for example in the embodiment shown, in the form of bays or slots 111, 112 . . . 118 and 121, 122 . . . 128, respectively. The locations provided on each server rack may take other forms to which the servers may be received and positioned, for example compartments, chambers, shelves and the like. Each slot is configured to receive a server, such as the servers 212, 214, 218 and 223 shown in the example of FIG. 1. Each rack 110, 120 has a unique rack identifier 110a, 120a, represented by one or more characters, digits, symbols or a combination thereof, for example in the embodiment shown, by an alphabetic character "A", "B", and so on. Likewise, each slot has a unique slot identifier 111a, 112a, etc., corresponding to the physical location of the slot in a particular server rack. For example in the embodiment shown, the unique slot identifier is illustrated as numbers 1, 2, 3 . . . 8, respectively, in each rack.

The server system 100 further includes a plurality of memory cards, for example memory cards 312, 321, 322, 323, 324, 325, 326, 327 and 328 shown in FIG. 1. Each memory card is programmed with information, for example a location identifier, relating to a location of the respective server at a particular server rack, e.g. the server rack number, the slot number on the server rack, etc. The location identifier is unique to a memory card and the corresponding slot within the server system 100, which can be determined based on the server rack identifier and the slot identifier. Taking slot 112 of server rack 110 as an example, slot 112 is physically located in slot number "2" of server rack "A", therefore the location identifier of memory card 312 may be determined as "A2" which is derived from the rack identifier "A" and slot identifier "2" of this particular slot. Similarly, the location identifier of memory card 321 is "B1", the location identifier of memory card 322 is "B2", and so on.

Figure 2:
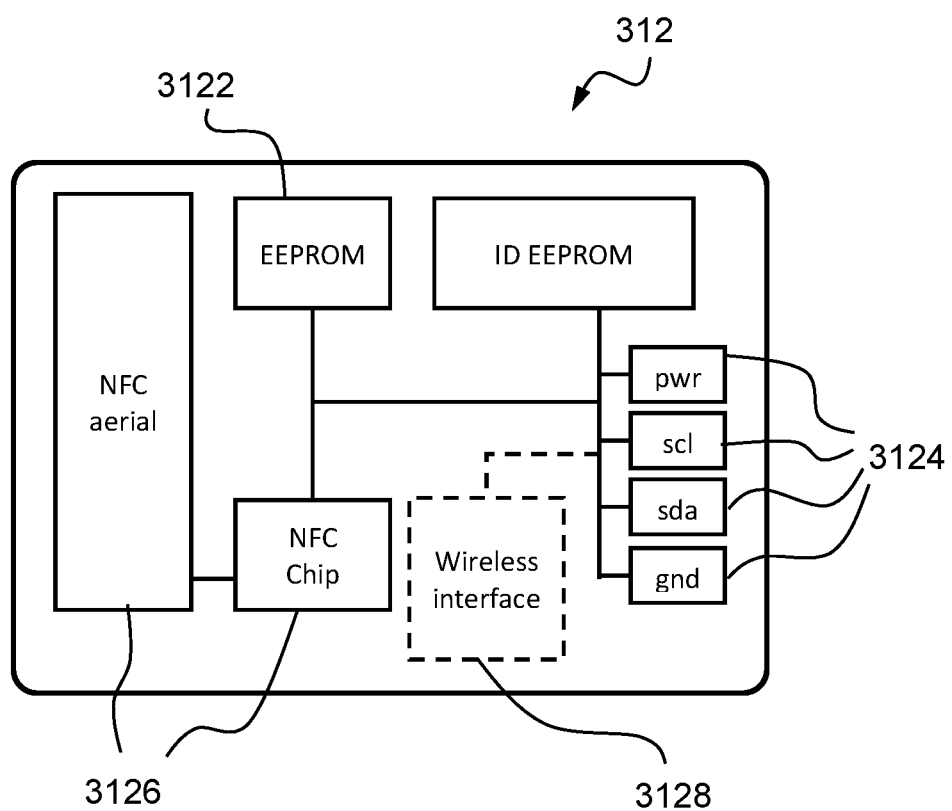
FIG. 2 is a diagram of a memory card of the server system of FIG. 1.

In reference to FIG. 2, the memory card 312 may include a data storage module, such as an electrically erasable programmable read-only memory (EEPROM) chip 3122 and a set of contact pads 3124 coupled to the EEPROM chip 3122. Contact pads 3124 may be configured to include four terminals, such as "pwr", "scl", "sda" and "gnd", respectively, according to an appropriate data communication protocol, such as the Inter-Integrated Circuit (I2C) protocol. The location identifier of memory card 312, such as "A2", is programmed and stored in the memory module 3122 using a memory card writer (not shown). Alternatively or additionally, memory card 312 may include a wireless interface 3128, such as Near Field Communication (NFC) module or radiofrequency module for data transmission wirelessly. Optionally, the EEPROM chip may be substituted with some other form of non-volatile memory.

Figure 3:
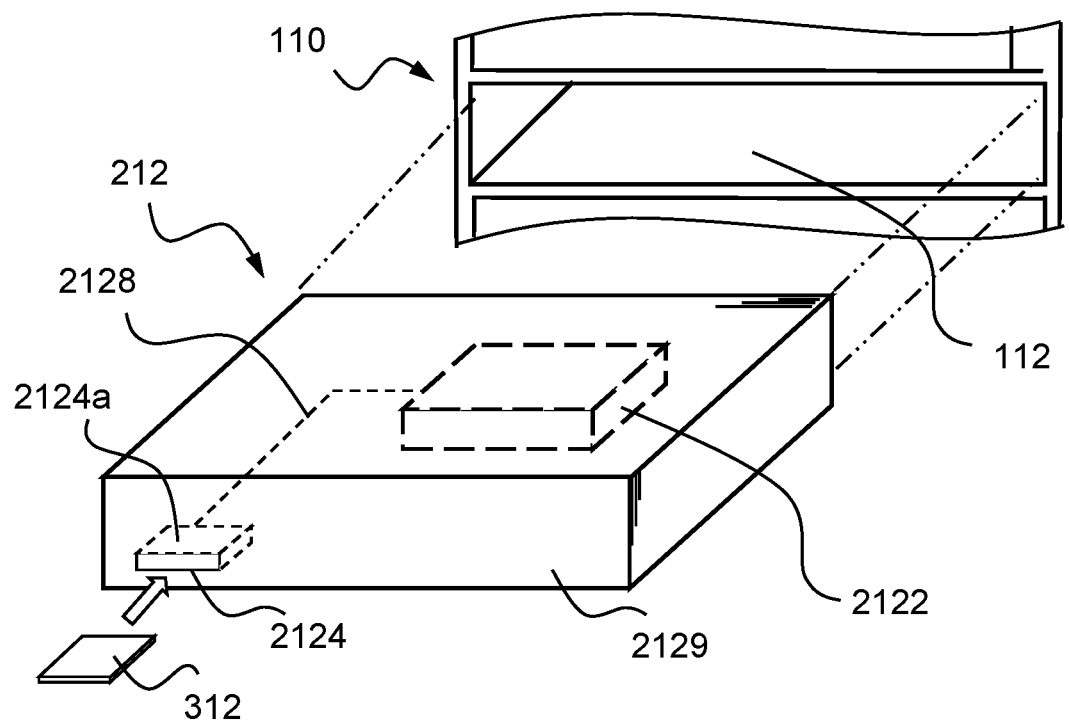
FIG. 3 is a diagram of a server of the server system of FIG. 1.

In reference to FIG. 3, the server 212 may include a controller 2122, such as a Baseboard Management Controller (BMC), and an interface 2124 coupled to the controller 2122. The interface 2124 may include contact terminals for establishing wired connection with the memory card 312 through direct physical contact with the contact pads 3124 shown in FIG. 2. Alternatively or additionally, the interface 2124 may include wireless components for establishing a wireless connection with the memory card 213 through the wireless interface 3128 shown in FIG. 2. Upon the server 212 being received by and mounted to slot 112, the memory card 312 may be connected to the controller 2122 via the interface 2124, and is operable to communicate with the interface 2124, to transmit the information relating to the location of the respective server within the server rack to the controller 2122. The location identifier "A2" programmed and stored in the memory card 312 is then automatically read by the controller 2122. As such, the information specific to the physical location of slot 112, for example the rack identifier "A" and slot identifier "2", is transmitted to the controller 2122. Accordingly, the physical location of server 212 in the server system 100 (see FIG. 1) may be automatically determined by the controller 2122. Based on the location identifier, and a server identifier such as the serial number of the server, the controller 2122 may further determine an IP address e.g. an IPv6 address dedicated to the server 212 that is mounted to slot 112. For example, the controller may access the IP address in a lookup table that associates the IP address with the location identifier. Alternatively, the controller may assign an IP address that is based on, or is a function of, the location identifier.

Referring again to FIG. 2, the memory card 312 may include a second wireless module, for example a Near Field Communication (NFC) module 3126 with an NFC chip and NFC aerial or antenna coupled to the data storage module 3122. When the memory card 312 includes a second wireless module, such as module 3126, a user is able to access the information stored on the memory card 312, by interrogating the memory card 312 via a corresponding wireless device, such as an NFC reader (now shown in the figures). The NFC module 3126 may also enable a user to access information stored on the controller 2122 to perform an audit, or to communicate with the controller 2122 via a corresponding wireless device.

Figure 4:
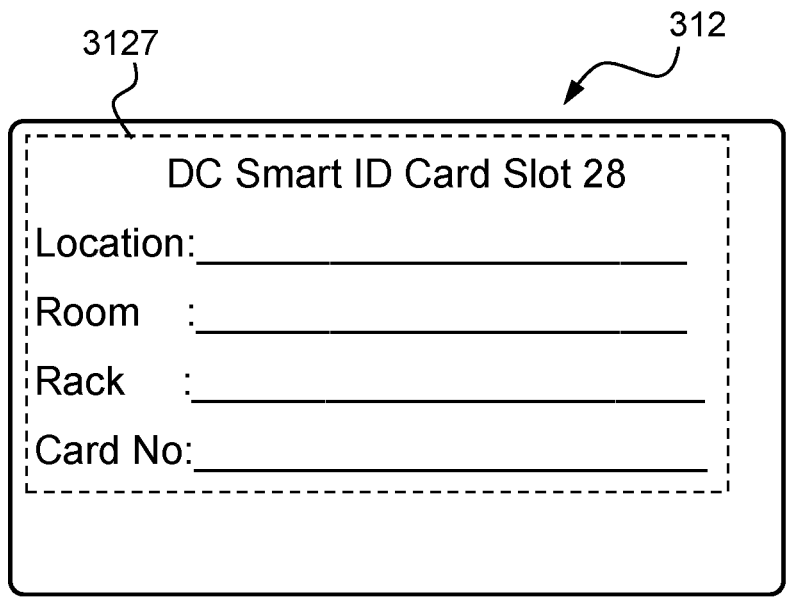
FIG. 4 is a top view of the memory card shown in FIG. 1.

In FIG. 4, the memory card 312 is shown having an optional writing area 3127 provided on its top and/or bottom surface, to enable the display of visually identifiable information such as the location of the server, the data room in which the server rack is housed, the rack/slot number with which the card corresponds, as well as the card number, etc. Such information may be hand-written or printed directly thereon, or perhaps on a sticker, for the easy reference by a user.

In the embodiment shown in FIG. 3, the interface 2124 may include a card reader receptacle 2124a mounted directly to the casing or enclosure 2129 of the server 212, and electrically connected to controller 2122 by a data cable 2128. The card reader receptacle 2124a may, without limitation, open to the front side of the server 212, facilitating easy and convenient access by the memory card 312 insertion into and retrieval from the card reader receptacle 2124a.

Figure 5:
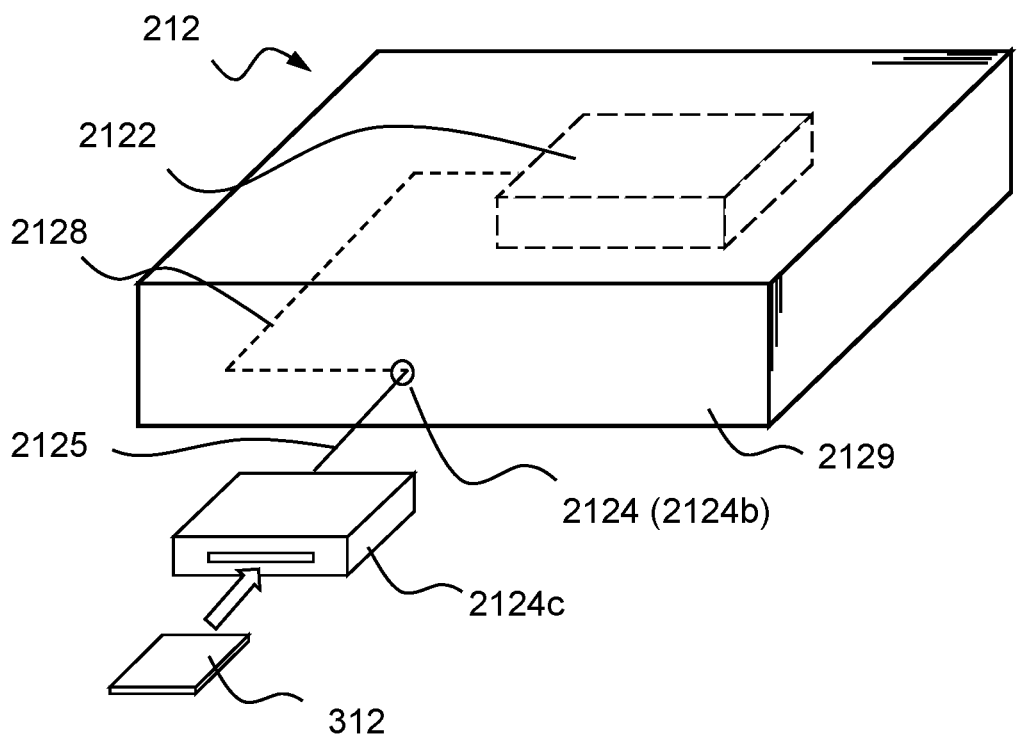
FIG. 5 is a diagram of a server according to another embodiment.

In another embodiment, as shown in FIG. 5, the interface 2124 may include a cable connector 2124*b* and a card reader 2124*c* electrically connected to the cable connector 2124*b*. Cable connector 2124*b* is preferably mounted directly to the casing of server 212, and electrically connected to controller 2122 by a data cable. When the server 212 is mounted to the server rack at the designated slot, the card reader 2124*c* may be connected to the cable connector 2124*b* and the memory card may be inserted into the card reader 2124*c*, such that the location identifier programmed and stored in the memory card 312 can be transmitted to the controller 2122 in order to complete the automatic identification of the server 212. In this embodiment, the card reader 2124*c* need not be permanently physically mounted to the server 212 nor occupy space in the enclosure 2129 of the server 212. Optionally, the card reader 2124*c* may be attached to the server rack 110.

As can be appreciated according to the illustrated embodiments above, a data center or server room having the capacity of housing multiple servers may be provided with an equal quantity of memory cards, each memory card being programmed with a unique location identifier, on a one-to-one basis, corresponding to a dedicated slot of a specific server rack. The memory cards may be programmed and stored with a respective location identifier therein on a batch-basis, and provided to the data center or server room. Alternatively, one or more memory card may be programmed individually and/or on an ad hoc basis.

Figure 6:
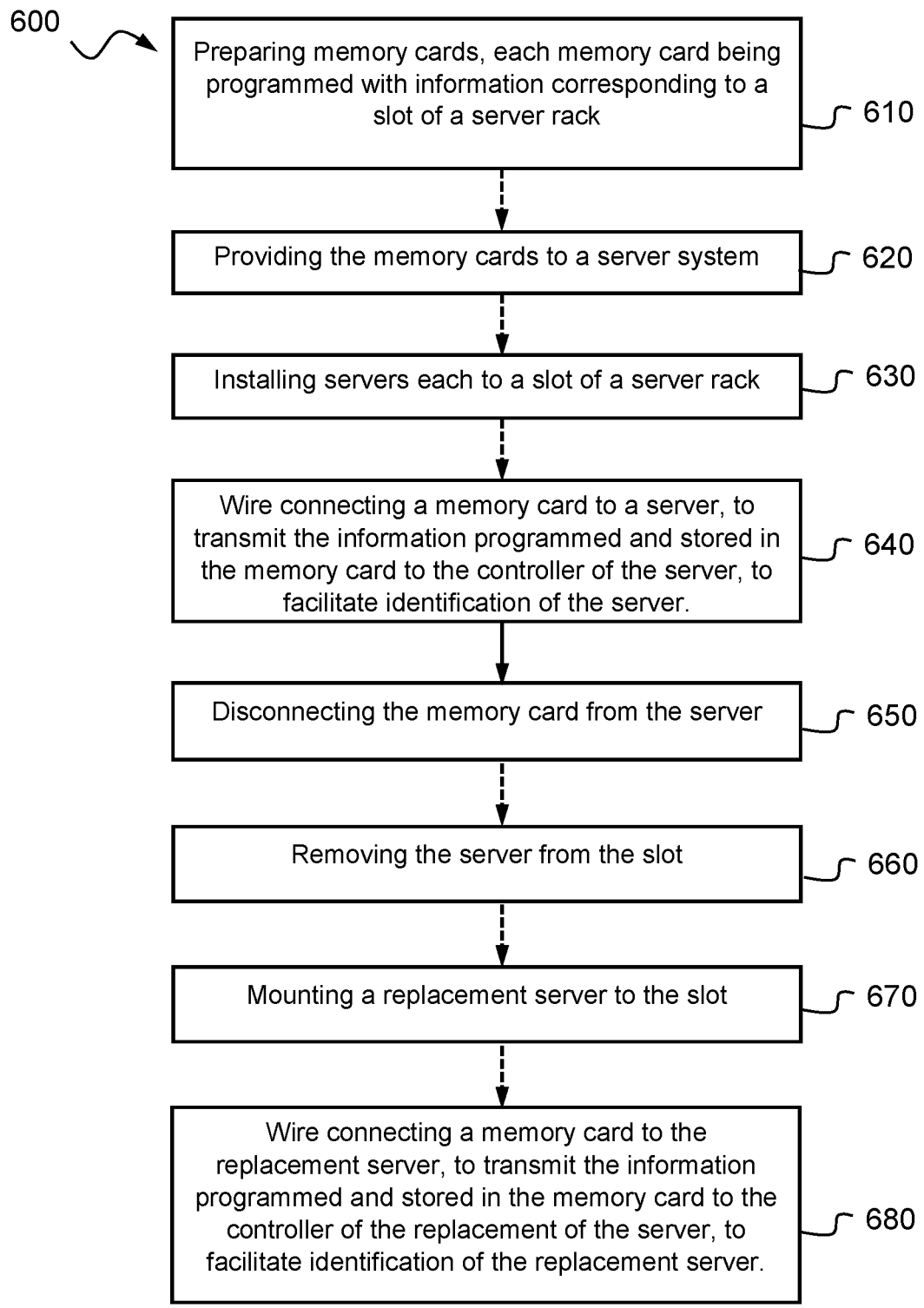
FIG. 6 is a flow chart illustrating an embodiment of a server identification method.

In a server identification method as illustrated in FIG. 6, at block 610, a plurality of memory cards are prepared by programming information, for example a location identifier corresponding to a particular slot of a particular server rack, into each of the memory cards. At block 620, the memory cards are delivered or otherwise provided to a server system, such as a data center or a server room. At block 630, one or more servers are installed to the data center, with each server inserted into a slot on a server rack. At block 640, the memory card corresponding to each slot is connected by a wired or wireless electrical connection to the server mounted in the same slot, to transmit the location identifier programmed and stored in the memory card to the controller of the server, to facilitate identification of the server. Specifically, a particular memory card "corresponds" with, or is "associated" with, a particular server slot by virtue of having been programmed with the location identifier that uniquely identifies the server slot.

In one optional embodiment, the method may continue to further include, at block 650, disconnecting the memory card from the server and at block 660, removing the server from the slot. At block 670, a new server is mounted to the same slot as replacement, and at block 680, the memory card is connected to the new server to transmit the location identifier to the new server to enable identification of the new server.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable those persons having an ordinary level of skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

It will be understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the present description, numerous specific details are provided to give a thorough understanding of various embodiments. One skilled in the relevant art will recognize, however, that the various embodiments can be practiced without one or more of the specific details, or with other methods, components, materials, etc. In other instances, some or all known structures, materials, or operations may not be shown or described in detail to avoid obfuscation.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing.

Computer program code for carrying out various operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. A server system comprising:
a server rack including a plurality of slots;
a plurality of servers, each server being positioned at a respective slot within the server rack, and each server including a baseboard management controller and an externally-accessible interface coupled to the baseboard management controller; and
a plurality of memory cards, each memory card having a non-volatile storage module storing a location identifier that uniquely identifies one of the plurality of slots, and each memory card being operable to communicate through the externally-accessible interface of a respective one of the servers to transmit the stored location identifier to the baseboard management controller of the respective server.

2. The server system of claim 1, wherein the interface comprises a card reader coupled to the server, wherein the card reader receives the memory card therein to establish communication with the memory card.

3. The server system of claim 2, wherein the card reader is fixedly mounted to the server and opens to a front side of the server for receiving the memory card.

4. The server system of claim 2, wherein the interface includes a cable connector mounted to the server, wherein the card reader is detachably connected to the cable connector.

5. The server system of claim 1, wherein the non-volatile storage module is an electrically erasable programmable read-only memory chip.

6. The server system of claim 1, wherein the interface comprises a card reader coupled to the server, and wherein the memory card further includes a wireless communication module coupled to the non-volatile storage module to wirelessly transmit the location identifier stored on the memory card to the card reader.

7. The memory card of claim 6, wherein the wireless communication module includes a near-field communication chip.

8. The server system of claim 1, wherein the baseboard management controller derives an Internet Protocol address for the server based on the location identifier of the respective server and a server identifier associated with the server.

9. A server comprising:
a baseboard management controller; and
an externally-accessible interface coupled to the baseboard management controller;
wherein the interface is configured to selectively couple with a memory card and enable the baseboard management controller to receive a location identifier stored by the memory card.

10. The server of claim 9, wherein the externally-accessible interface includes a card reader coupled to the server, wherein the card reader receives the memory card therein and establishes communication with the memory card.

11. The server system of claim 10, wherein the card reader is fixedly secured to the server and opens to a front side of the server for receiving the memory card.

12. The server system of claim 10, wherein the interface includes a cable connector mounted to the server, wherein the card reader is detachably connected to the cable connector.

* * * * *